United States Patent
Chen et al.

(10) Patent No.: US 9,829,786 B2
(45) Date of Patent: Nov. 28, 2017

(54) PSM BLANK FOR ENHANCING SMALL SIZE CD RESOLUTION

(71) Applicant: TAIWAN SEMICONDUCTOR MANUFACTURING CO., LTD., Hsinchu (TW)

(72) Inventors: Chun-Lang Chen, Tainan (TW); Tzung-Shiun Liu, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 199 days.

(21) Appl. No.: 14/754,377

(22) Filed: Jun. 29, 2015

(65) Prior Publication Data

US 2016/0377974 A1    Dec. 29, 2016

(51) Int. Cl.
*G03F 1/26* (2012.01)
*G03F 1/76* (2012.01)
*G03F 1/80* (2012.01)

(52) U.S. Cl.
CPC ............. *G03F 1/26* (2013.01); *G03F 1/76* (2013.01); *G03F 1/80* (2013.01)

(58) Field of Classification Search
CPC ..... G03F 1/26; G03F 1/29; G03F 1/76; G03F 1/80
USPC .............................................................. 430/5
See application file for complete search history.

(56) References Cited

U.S. PATENT DOCUMENTS

| | | | |
|---|---|---|---|
| 8,715,890 B2* | 5/2014 | Tu | H01L 21/31 257/673 |
| 9,229,317 B2* | 1/2016 | Nam | G03F 1/50 |
| 2014/0004449 A1* | 1/2014 | Nam | G03F 1/50 430/5 |

* cited by examiner

*Primary Examiner* — Christopher Young
(74) *Attorney, Agent, or Firm* — Maschoff Brennan

(57) ABSTRACT

A phase shift mask blank includes a transparent substrate, a phase shift layer, a first hard mask layer and an opaque layer. The transparent substrate is disposed on the transparent substrate. The first hard mask layer is disposed on the phase shift layer. The phase shift layer has an etching selectivity with respect to the first hard mask layer. The opaque layer is disposed on the first hard mask layer.

13 Claims, 11 Drawing Sheets

PSM BLANK FOR ENHANCING SMALL SIZE CD RESOLUTION

BACKGROUND

In semiconductor device manufacturing technologies, photolithography is typically used to transfer a pattern for forming semiconductor features onto a semiconductor wafer for the formation of integrated circuits. During a photolithographic process, light passes through a photomask to expose a photosensitive layer formed on a surface of the semiconductor wafer. The photomask includes predetermined circuitry patterns. The predetermined circuitry patterns may have attenuating regions and non-attenuating regions, so that the light can be modulated in both intensity and phase. In a typical photolithographic process, exposed portions of the photosensitive layer are developed to form a pattern for subsequent processes, such as etching features into underlying material layers.

As feature sizes of the semiconductor devices have decreased to sizes smaller than the wavelength of light used in photolithographic processes, diffraction or optical fringing and interference of light passing through a photomask become more significant in forming the features with small critical dimensions (CDs). The diffraction or optical fringing and interference of the light cause undesired light exposure on the photosensitive layer in undesired regions, thus resulting in loss of pattern resolution in transferring of the photomask pattern.

In order to increase the resolution of a transferred photolithographic pattern, a phase shift mask (PSM) has been developed. Phases of wavefronts of light passing through a photomask pattern of the phase shift mask are intentionally phase shifted in selected portions to selectively produce destructive interference, thereby reducing undesired light exposures of a photosensitive layer due to diffraction of light passing through the patterned photomask. However, the conventional PSM is not entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
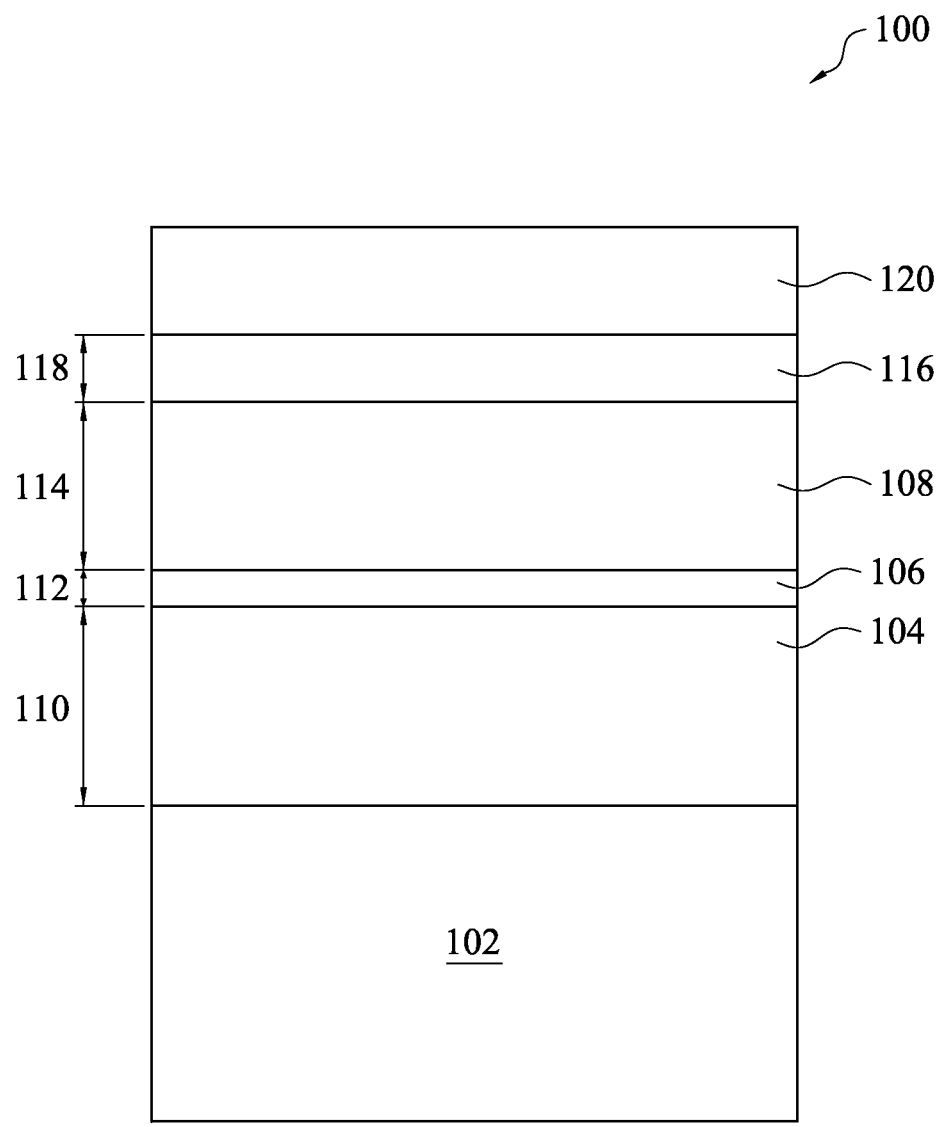
FIG. 1 is a schematic cross-sectional view of a phase shift mask blank in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a typical process for manufacturing a phase shift mask, various smaller auxiliary features, such as scattering bars, are formed adjacent to larger main features for optical proximity correction. However, due to the resolution limitation of photosensitive material and an intrinsic loading effect between the main features and the auxiliary features, the auxiliary features are shortened and rounded, and thus significant critical dimension loss of the auxiliary features occurs from a developing process to an etching process. As a result, the effect of optical proximity correction of the typical phase shift mask is limited.

Embodiments of the present disclosure are directed to providing a phase shift mask blank, a phase shift mask and a method for manufacturing a phase shift mask, in which a hard mask layer is formed on a phase shift layer and between the phase shift layer and an opaque layer, and the phase shift layer has an etching selectivity with respect to the hard mask layer. During etching of the phase shift layer, the hard mask layer on the phase shift layer is more difficult to be etched than the phase shift layer. Thus, etching bias of the phase shift layer between larger main features and smaller auxiliary features is significantly decreased, the problem of shortening and rounding the auxiliary features is improved, thereby effectively preventing critical dimension shrinkage of the auxiliary features, thus achieving an accurate and effective optical proximity correction. Furthermore, with the application of the embodiments, the addition of the hard mask layer is compatible with the process for manufacturing a photomask without impacting the photomask making cycle time. Moreover, the hard mask layer is removed from the main features and the auxiliary features, such that the optical behaviors of the phase shift mask are not affected.

FIG. 1 is a schematic cross-sectional view of a phase shift mask blank in accordance with various embodiments. A phase shift mask blank 100 may be an attenuated phase shift mask blank. In some embodiments, the phase shift mask blank 100 includes a transparent substrate 102, a phase shift layer 104, a hard mask layer 106 and an opaque layer 108. The transparent substrate 102 may be a quartz flat plate.

The phase shift layer 104 is disposed on the transparent substrate 102. In some examples, the phase shift layer 104 includes a MoSi layer. The phase shift layer 104 has a thickness 110. For example, the thickness 110 of the phase shift layer 104 may range from about 69 nm to about 76 nm. The hard mask layer 106 is disposed on the phase shift layer 104. The hard mask layer 106 has a thickness 112. The thickness 110 of the phase shift layer 104 may be greater than the thickness 112 of the hard mask layer 106. For example, the thickness 112 of the hard mask layer 106 may range from about 3 nm to about 10 nm.

The phase shift layer 104 has an etching selectivity with respect to the hard mask layer 106. For example, an etching rate of the phase shift layer 104 is greater than an etching rate of the hard mask layer 106. The hard mask layer 106 may be formed from a transparent material, or may be formed from an opaque material. In some examples, the hard mask layer 106 includes a MoSi based material, such as MoSi. In the examples that the phase shift layer 104 includes a MoSi layer and the hard mask layer 106 includes a MoSi layer, the MoSi layer of the hard mask layer 106 is harder than the MoSi layer of the phase shift layer 104. In some exemplary examples, the MoSi based material of the hard mask layer 106 contains about 1 weight percent to about 2 weight percent molybdenum, about 50 weight percent to about 55 weight percent silicon and about 40 weight percent to about 50 weight percent nitrogen.

In some examples, the hard mask layer 106 includes $Si_xN_y$, $SiO_2$, $SiO_uN_v$, or any combination thereof, where u, v, x, y are greater than 0. In certain examples, the hard mask layer 106 includes a multilayered structure, such as a metal layer and a metal oxide layer under the metal layer. For example, the hard mask layer 106 includes a tantalum layer and a tantalum oxide layer under the tantalum layer, or a titanium layer and a titanium oxide layer under the titanium layer.

The opaque layer 108 is disposed on the hard mask layer 106. The opaque layer 108 is used to fabricate a pattern transfer layer which includes patterns desired to be transferred onto a wafer. In some examples, the opaque layer 108 includes Cr or $CrO_x$, where x is greater than 0. The opaque layer 108 has a thickness 114. In some exemplary examples, the thickness 114 of the opaque layer 108 may range from about 44 nm to about 52 nm.

The hard mask layer 106 is disposed on the phase shift layer 104 and between the phase shift layer 104 and the opaque layer 108, and as compared with the phase shift layer 104, the hard mask layer 106 is more difficult to be etched, such that etching bias due to an intrinsic loading effect between smaller auxiliary features and larger main features is significantly reduced during etching of the hard mask layer 106 and the phase shift layer 104, and the problem of shortening and rounding the auxiliary features is improved, and thus the auxiliary features are formed without apparent critical dimension shrinkage. Therefore, the optical proximity correction can be effectively performed because the critical dimension loss of the auxiliary features of a phase shift mask is effectively decreased, thereby enhancing fidelity of transferred main features on a wafer.

In some examples, as shown in FIG. 1, the phase shift mask blank 100 optionally includes another hard mask layer 116. The hard mask layer 116 is disposed on the opaque layer 108. The hard mask layer 116 is used to be an etching mask during etching of the opaque layer 108. In some examples, the hard mask layer 116 includes $SiO_2$ or $SiO_xN_y$, where x, y are greater than 0. The hard mask layer 116 has a thickness 118. In some exemplary examples, the thickness 118 of the hard mask layer 116 ranges from about 3 nm to about 15 nm. For example, the thickness 118 of the hard mask layer 116 may range from about 5 nm to about 10 nm.

In some certain examples, the thickness 110 of the phase shift layer 104 is about 76 nm, the thickness 114 of the opaque layer 108 is about 44 nm, and the thickness 118 of the hard mask layer 116 is about 5 nm. In some certain examples, the thickness 110 of the phase shift layer 104 is about 69 nm, the thickness 114 of the opaque layer 108 is about 52 nm, and the thickness 118 of the hard mask layer 116 is about 5 nm. In some certain examples, the thickness 110 of the phase shift layer 104 is about 69 nm, the thickness 114 of the opaque layer 108 is about 48 nm, and the thickness 118 of the hard mask layer 116 is about 10 nm.

In some examples, referring to FIG. 1 again, the phase shift mask blank 100 optionally includes a photosensitive layer 120. The photosensitive layer 120 is disposed on the hard mask layer 116. The photosensitive layer 120 is used to be an etching mask during etching of the hard mask layer 116. In some examples, the photosensitive layer 120 includes a photoresist material.

Figure 2:
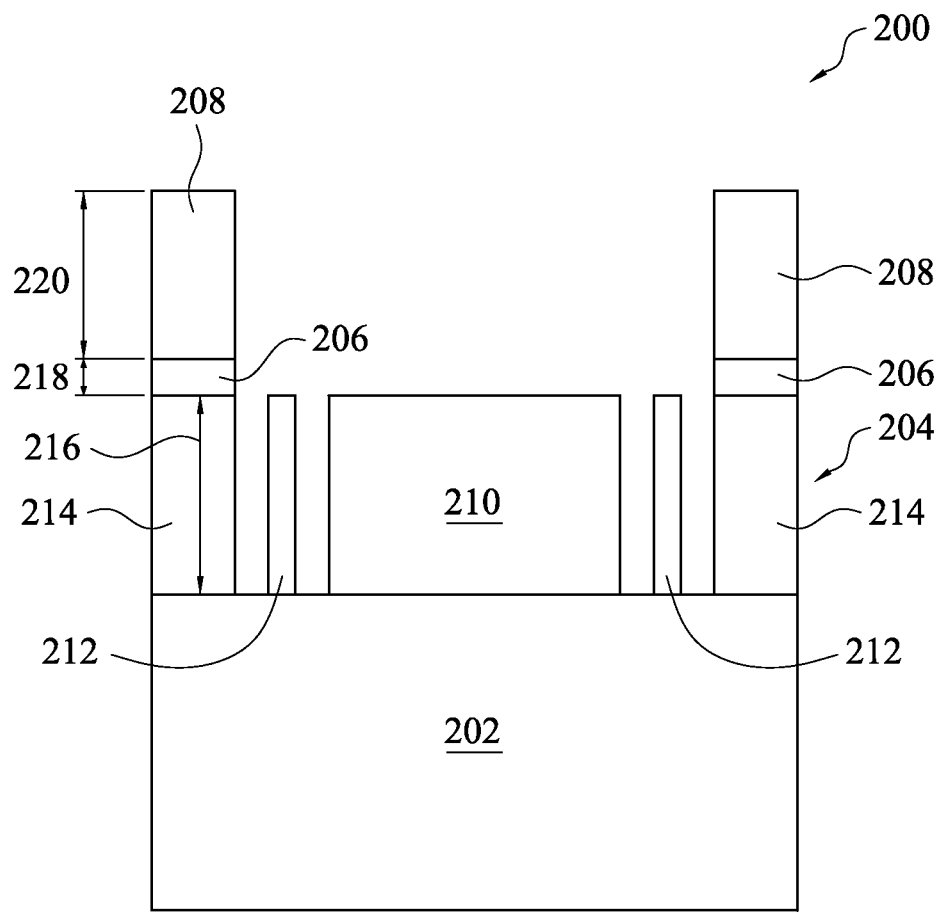
FIG. 2 is a schematic cross-sectional view of a phase shift mask in accordance with various embodiments.

FIG. 2 is a schematic cross-sectional view of a phase shift mask in accordance with various embodiments. A phase shift mask 200 may be an attenuated phase shift mask (APSM). In some embodiments, the phase shift mask 200 includes a transparent substrate 202, a phase shift layer 204, a hard mask layer 206 and an opaque layer 208. The transparent substrate 202 may be a quartz flat plate.

The phase shift layer 204 is disposed on a portion of a surface of the transparent substrate 202 and exposes the other portion of the surface of the transparent substrate 202. In some examples, the phase shift layer 204 includes at least one main feature 210, at least one auxiliary feature 212 and a border 214. In some exemplary examples, as shown in FIG. 2, the phase shift layer 204 includes two auxiliary features 212. The auxiliary features 212 are separated from the main feature 210 and are adjacent to the main feature 210. The border 214 encloses the main feature 210 and the auxiliary features 212. The auxiliary features 212 may be optical proximity correction features, and the auxiliary features 212 are not large enough to be resolved on a photosensitive material but large enough to affect the behavior of light illuminating the main feature 210. In some exemplary examples, the auxiliary features 212 are scattering bars. In some examples, the phase shift layer 204 includes a MoSi layer.

The hard mask layer 206 is disposed on the border 214 of the phase shift layer 204. A thickness 216 of the phase shift layer 204 may be greater than a thickness 218 of the hard mask layer 206. In some exemplary examples, the thickness 216 of the phase shift layer 204 may range from about 69 nm to about 76 nm, and the thickness 218 of the hard mask layer 206 may range from about 3 nm to about 10 nm.

The phase shift layer 204 has an etching selectivity with respect to the hard mask layer 206. For example, an etching rate of the hard mask layer 206 is smaller than an etching rate of the phase shift layer 204. The hard mask layer 206 may be formed from a transparent material, or may be formed from an opaque material. In some examples, the hard mask layer 206 includes a MoSi based material, such as MoSi. In the examples that the phase shift layer 204 includes a MoSi layer and the hard mask layer 206 includes a MoSi layer, the MoSi layer of the hard mask layer 206 is harder than the MoSi layer of the phase shift layer 204. In some exemplary examples, the MoSi based material of the hard mask layer 206 contains about 1 weight percent to about 2 weight percent molybdenum, about 50 weight percent to about 55 weight percent silicon and about 40 weight percent to about 50 weight percent nitrogen.

In some examples, the hard mask layer 206 includes $Si_xN_y$, $SiO_2$, $SiO_uN_v$, or any combination thereof, where u, v, x, y are greater than 0. In certain examples, the hard mask layer 206 includes a multilayered structure, such as a metal layer and a metal oxide layer under the metal layer. For example, the hard mask layer 206 includes a tantalum layer and a tantalum oxide layer under the tantalum layer, or a titanium layer and a titanium oxide layer under the titanium layer.

The opaque layer 208 is disposed on the hard mask layer 206. The opaque layer 208 is a pattern transfer layer which includes patterns desired to be transferred onto a wafer. In some examples, the opaque layer 208 includes Cr or $CrO_x$, where x is greater than 0. The opaque layer 208 has a thickness 220. In some exemplary examples, the thickness 220 of the opaque layer 208 ranges from about 44 nm to about 52 nm.

With the hard mask layer 206, which is more difficult to be etched than the phase shift layer 204, disposed on the phase shift layer 204 and between the phase shift layer 204 and the opaque layer 208, etching bias due to an intrinsic loading effect between the auxiliary features 212 and the main feature 210 is significantly reduced during etching of the hard mask layer 106 and the phase shift layer 104, the problem of shortening and rounding the auxiliary features 212 is improved, and the auxiliary features 212 are formed without apparent critical dimension shrinkage. Therefore, the optical proximity correction can be effectively performed because the critical dimension loss of the auxiliary features 212 of the phase shift mask 200 is effectively decreased, thereby enhancing fidelity of transferred main features on a wafer.

Figure 3A:
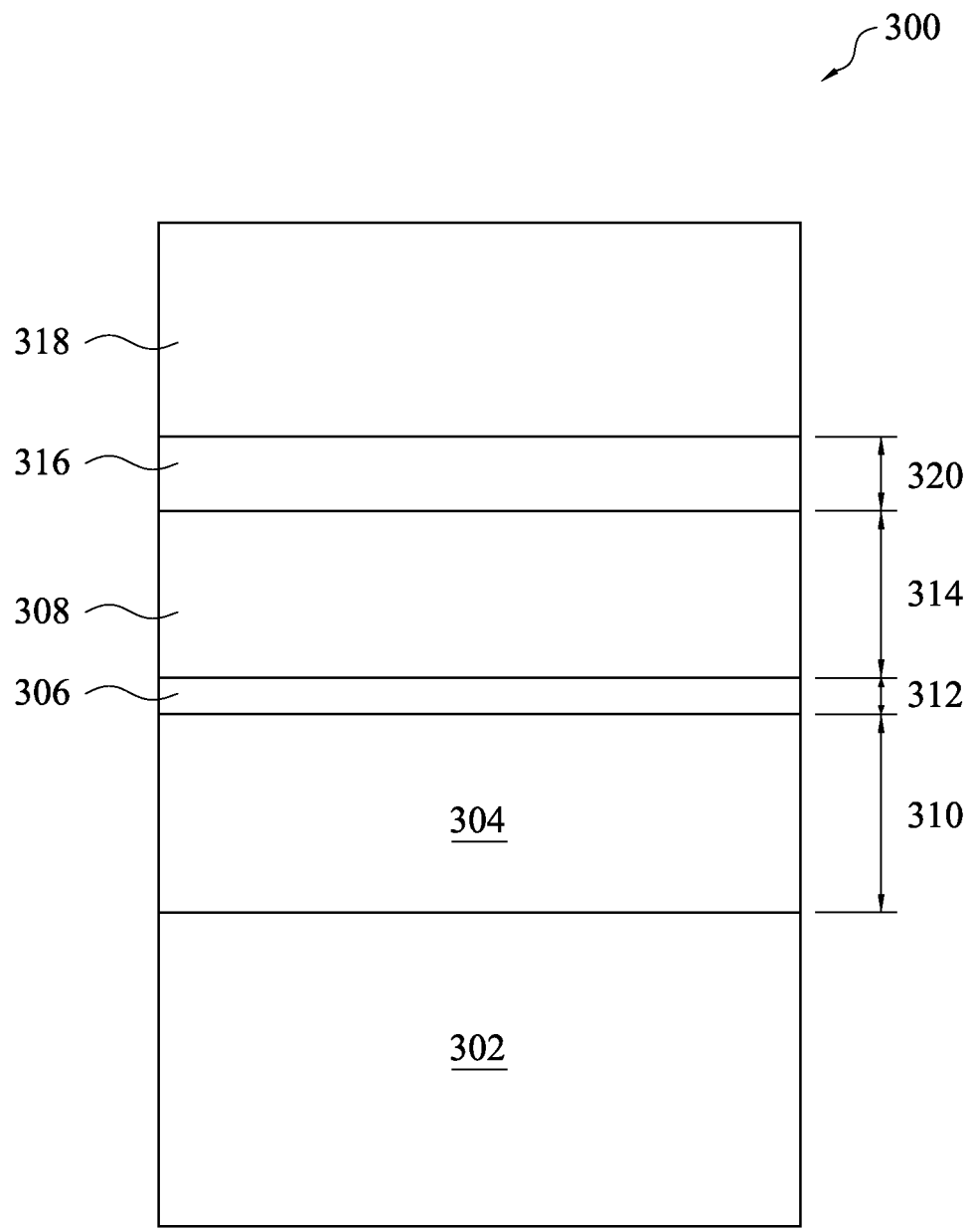
FIG. 3A through FIG. 3H are schematic cross-sectional views of intermediate stages showing a method for manufacturing a phase shift mask in accordance with various embodiments.

FIG. 3A through FIG. 3H are schematic cross-sectional views of intermediate stages showing a method for manufacturing a phase shift mask in accordance with various embodiments. As shown in FIG. 3A, a phase shift mask blank 300 is provided. In some examples, the phase shift mask blank 300 includes a transparent substrate 302, a phase shift layer 304, a hard mask layer 306 and an opaque layer 308. The phase shift layer 304, the hard mask layer 306 and the opaque layer 308 are sequentially disposed on the transparent substrate 302. The transparent substrate 302 may be a quartz flat plate.

The phase shift layer 304 is formed on the transparent substrate 302 using a deposition technique, such as a chemical vapor deposition (CVD) technique. In some examples, the operation of forming the phase shift layer 304 includes forming the phase shift layer 304 including a MoSi layer. The hard mask layer 306 is formed on the phase shift layer 304 using a deposition technique, such as a chemical vapor deposition technique. In some examples, a thickness 310 of the phase shift layer 304 is greater than a thickness 312 of the hard mask layer 306. In some exemplary examples, the thickness 310 of the phase shift layer 304 may range from about 69 nm to about 76 nm, and the thickness 312 of the hard mask layer 306 may range from about 3 nm to about 10 nm.

The phase shift layer 304 has an etching selectivity with respect to the hard mask layer 306. For example, an etching rate of the phase shift layer 304 is greater than an etching rate of the hard mask layer 306. The hard mask layer 306 may be formed from a transparent material, or may be formed from an opaque material. In some examples, the operation of forming the hard mask layer 306 includes forming the hard mask layer 306 including a MoSi based material, such as MoSi. In the examples that the phase shift layer 304 includes a MoSi layer and the hard mask layer 306 includes a MoSi layer, the MoSi layer of the hard mask layer 306 is harder than the MoSi layer of the phase shift layer 304. In some exemplary examples, the MoSi based material of the hard mask layer 306 is formed to contain about 1 weight percent to about 2 weight percent molybdenum, about 50 weight percent to about 55 weight percent silicon and about 40 weight percent to about 50 weight percent nitrogen.

In some examples, the operation of forming the hard mask layer 306 includes forming the hard mask layer 306 including $Si_xN_y$, $SiO_2$, $SiO_uN_v$, or any combination thereof, where u, v, x, y are greater than 0. In certain examples, the hard mask layer 306 is formed to include a multilayered structure, such as a metal layer and a metal oxide layer under the metal layer. For example, the hard mask layer 306 includes a tantalum layer and a tantalum oxide layer under the tantalum layer, or a titanium layer and a titanium oxide layer under the titanium layer.

The opaque layer 308 is formed on the hard mask layer 306 using a deposition technique, such as a sputtering deposition technique or an evaporation deposition technique. In some examples, the operation of forming the opaque layer 308 includes forming the opaque layer 308 including Cr or $CrO_x$, where x is greater than 0. In some exemplary examples, a thickness 314 of the opaque layer 308 ranges from about 44 nm to about 52 nm.

In some examples, as shown in FIG. 3A, the phase shift mask blank 300 optionally includes a hard mask material layer 316 and a photosensitive layer 318. The hard mask material layer 316 is formed to blanketly cover the opaque layer 308 using a deposition technique, such as a chemical vapor deposition technique. In some examples, the operation of forming the hard mask material layer 316 includes forming the hard mask material layer 316 including $SiO_2$ or $SiO_xN_y$, where x, y are greater than 0. In some exemplary examples, a thickness 320 of the hard mask material layer 316 ranges from about 3 nm to about 15 nm. For example, the thickness 320 of the hard mask material layer 316 may range from about 5 nm to about 10 nm. The photosensitive layer 318 is formed to blanketly cover the hard mask material layer 316 using, for example, a spin coating technique. In some examples, the operation of forming the photosensitive layer 318 includes forming the photosensitive layer 318 including a photoresist material.

Figure 3B:
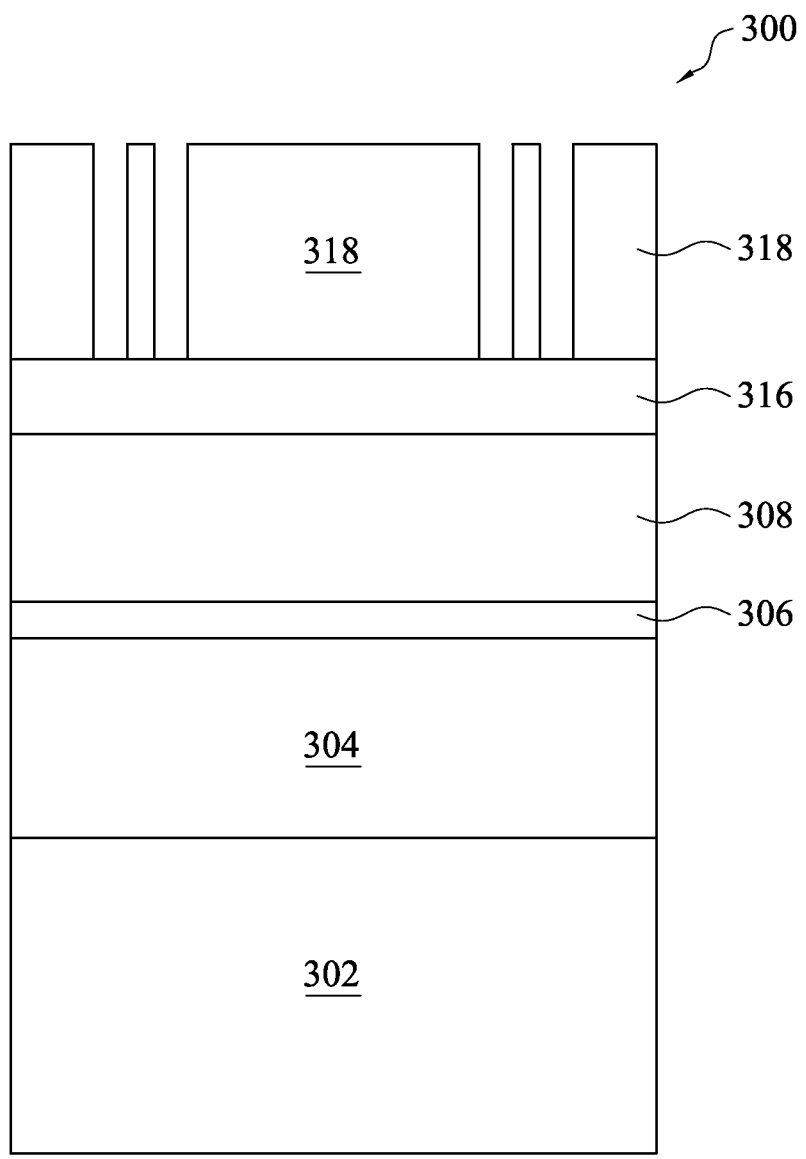

As shown in FIG. 3B, the photosensitive layer 318 is patterned using, for example, a photolithography technique. The operation of patterning the photosensitive layer 318 includes removing a portion of the photosensitive layer 318 to expose a portion of the hard mask material layer 316.

Figure 3C:
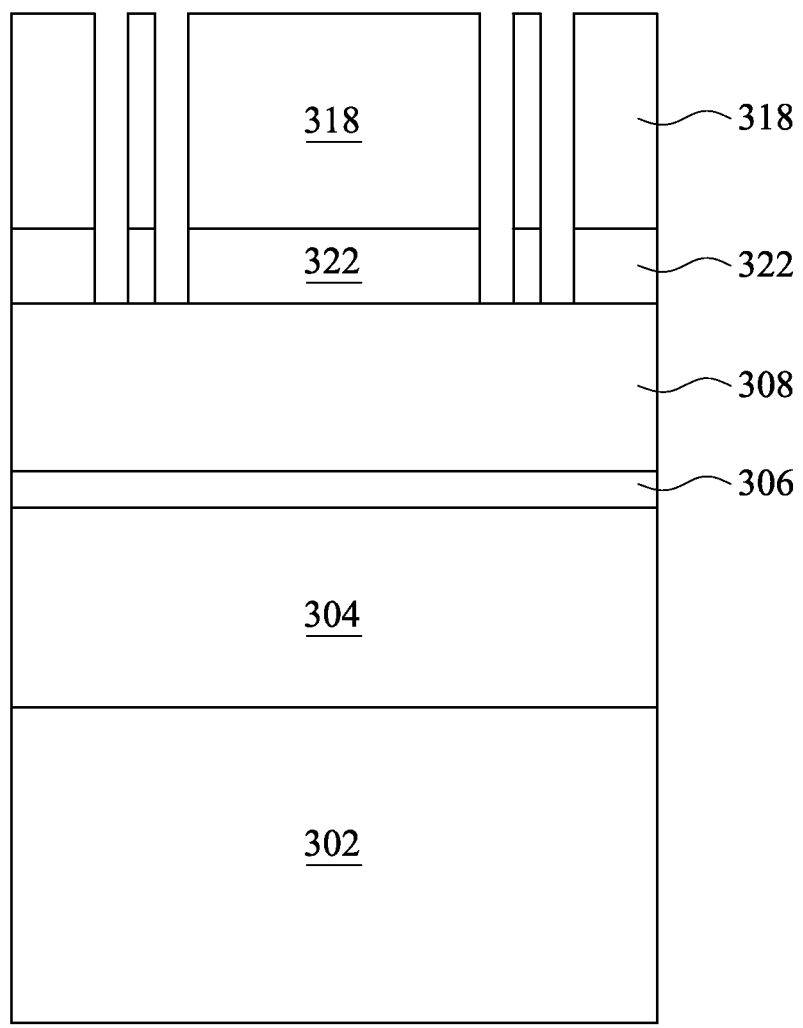
Figure 3D:
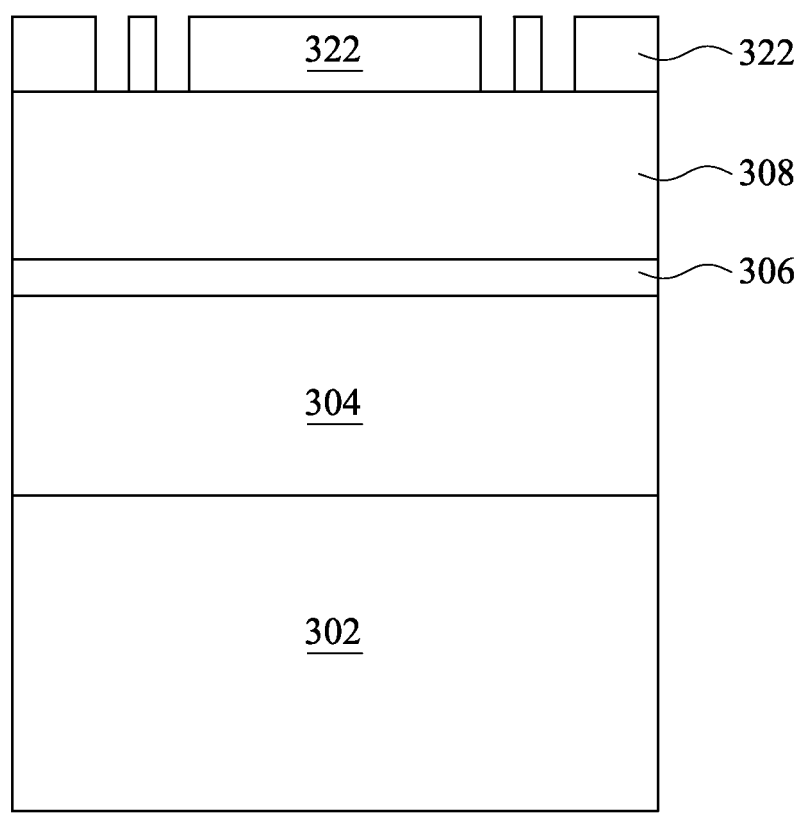

As shown in FIG. 3C, the portion of the hard mask material layer 316 exposed by the photosensitive layer 318 is removed by an etching technique, such as a dry etching technique, with the remaining portion of the photosensitive layer 318 as an etching mask, to transfer the pattern of the photosensitive layer 318 into the hard mask material layer 316, so as to form a hard mask layer 322. The operation of removing the portion of the hard mask material layer 316 includes exposing a portion of the opaque layer 308 under the portion of the hard mask material layer 316. After the formation of the hard mask layer 322 is completed, as shown in FIG. 3D, the remaining photosensitive layer 318 is removed using, for example, a stripping technique.

Figure 3E:
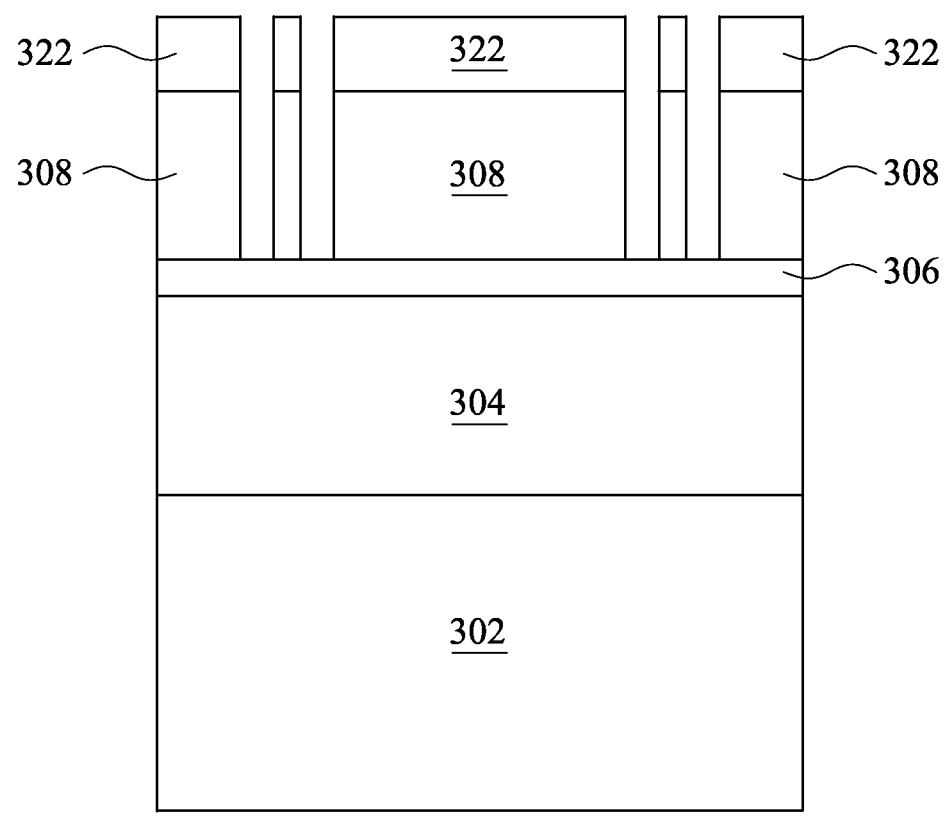

As shown in FIG. 3E, the portion of the opaque layer 308 exposed by the hard mask layer 322 is removed by an etching technique, such as a dry etching technique, with the hard mask layer 322 as an etching mask, to transfer the pattern of the hard mask layer 322 into the opaque layer 308.

The operation of removing the portion of the opaque layer 308 includes exposing a portion of the hard mask layer 306 under the portion of the opaque layer 308.

Figure 3F:
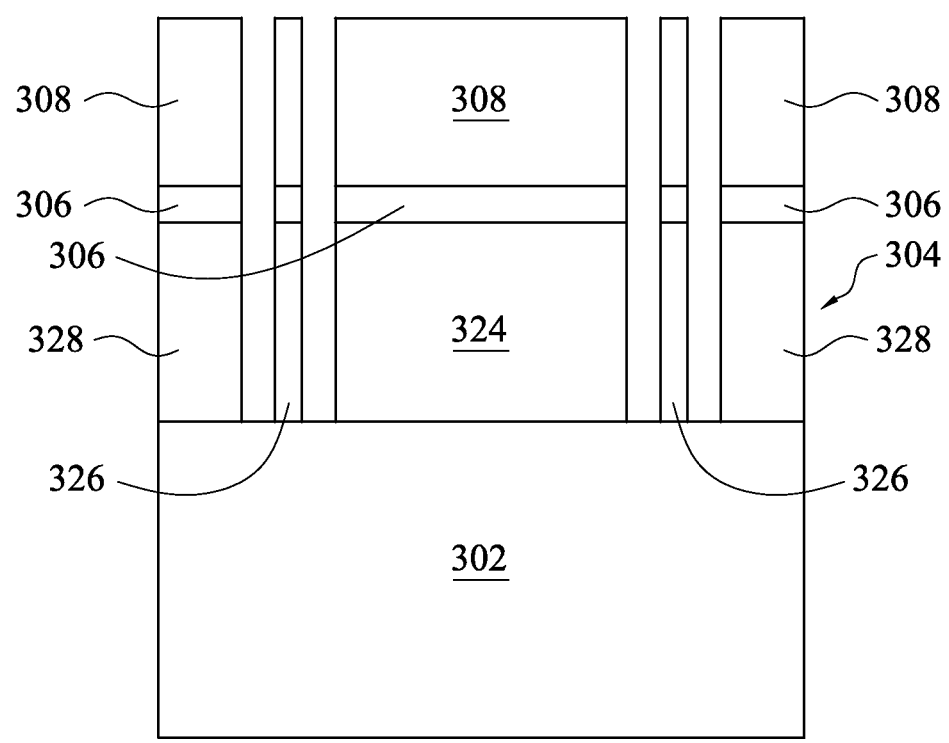

After the operation of removing the portion of the opaque layer 308 is completed, the hard mask layer 322 is removed. In some examples, the operation of removing the hard mask layer 322 is performed after a subsequent removing operation of the hard mask layer 306 and the phase shift layer 304. Then, as shown in FIG. 3F, the portion of the hard mask layer 306 exposed by the opaque layer 308 and a portion of the phase shift layer 304 underlying the hard mask layer 306 are removed by an etching technique, such as a dry etching technique, with the opaque layer 308 as an etching mask, to transfer the pattern of the opaque layer 308 into the hard mask layer 306 and the phase shift layer 304. The operation of removing the portion of the hard mask layer 306 and the portion of the phase shift layer 304 includes exposing a portion of the transparent substrate 302 under the portion of the phase shift layer 304.

Referring to FIG. 3F again, the operation of removing the portion of the phase shift layer 304 forms the phase shift layer 304 including at least one main feature 324, at least one auxiliary feature 326, and a border 328. In some exemplary examples, the phase shift layer 304 is formed to include two auxiliary features 326. The auxiliary features 326 are separated from the main feature 324 and are adjacent to the main feature 324. The border 328 encloses the main feature 324 and the auxiliary features 326. The auxiliary features 326 may be optical proximity correction features, such as scattering bars.

Figure 3G:
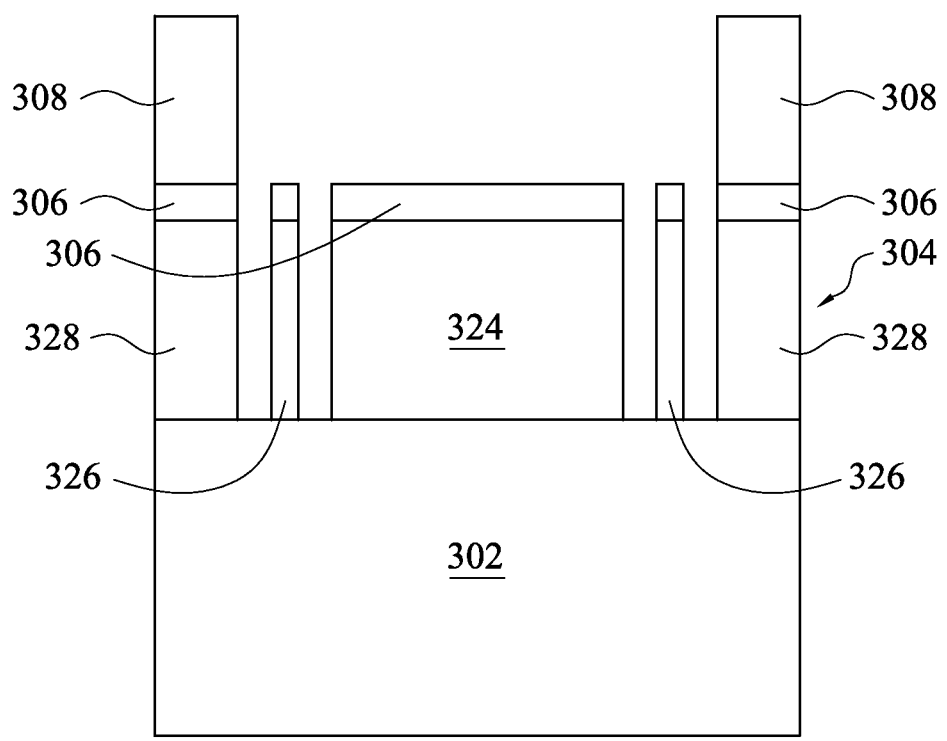
Figure 3H:
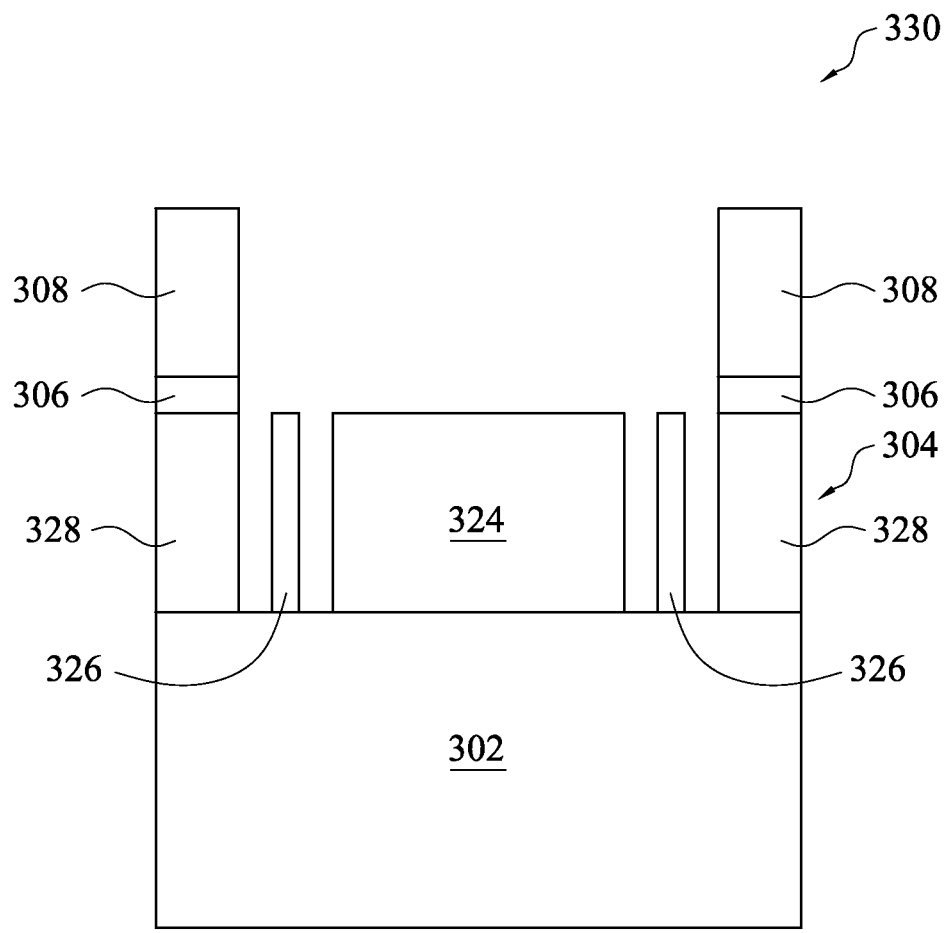

As shown in FIG. 3G, the portions of the opaque layer 308 on the main feature 324 and the auxiliary features 326 are removed to expose the portions of the hard mask layer 306 on the main feature 324 and the auxiliary features 326. As shown in FIG. 3H, the portions of the hard mask layer 306 on the main feature 324 and the auxiliary features 326 are removed to expose the main feature 324 and the auxiliary features 326, so as to complete manufacturing of a phase shift mask 330.

The hard mask layer 306 is disposed on the phase shift layer 304 and between the phase shift layer 304 and the opaque layer 308, and the hard mask layer 306 is more difficult to be etched than the phase shift layer 304, such that etching bias due to an intrinsic loading effect between the auxiliary features 326 and the main feature 324 is greatly reduced during etching, and the problem of shortening and rounding the auxiliary features 326 is improved. Thus, the auxiliary features 324 are formed without apparent critical dimension shrinkage, and the optical proximity correction can be effectively performed because the critical dimension loss of the auxiliary features 324 of the phase shift mask 304 is effectively decreased, thereby enhancing fidelity of transferred main features on a wafer. In addition, the hard mask layer 306 may include a MoSi based material while the phase shift layer 304 may include a MoSi layer, so that the addition of the hard mask layer 306 is compatible with the process for manufacturing a photomask, no additional step is needed, and thus the making cycle time of the phase shift mask 330 is not impacted. Moreover, the hard mask layer 306 is removed from the main feature 324 and the auxiliary features 326, such that the optical behaviors of the phase shift mask 304 are not affected.

Figure 4:
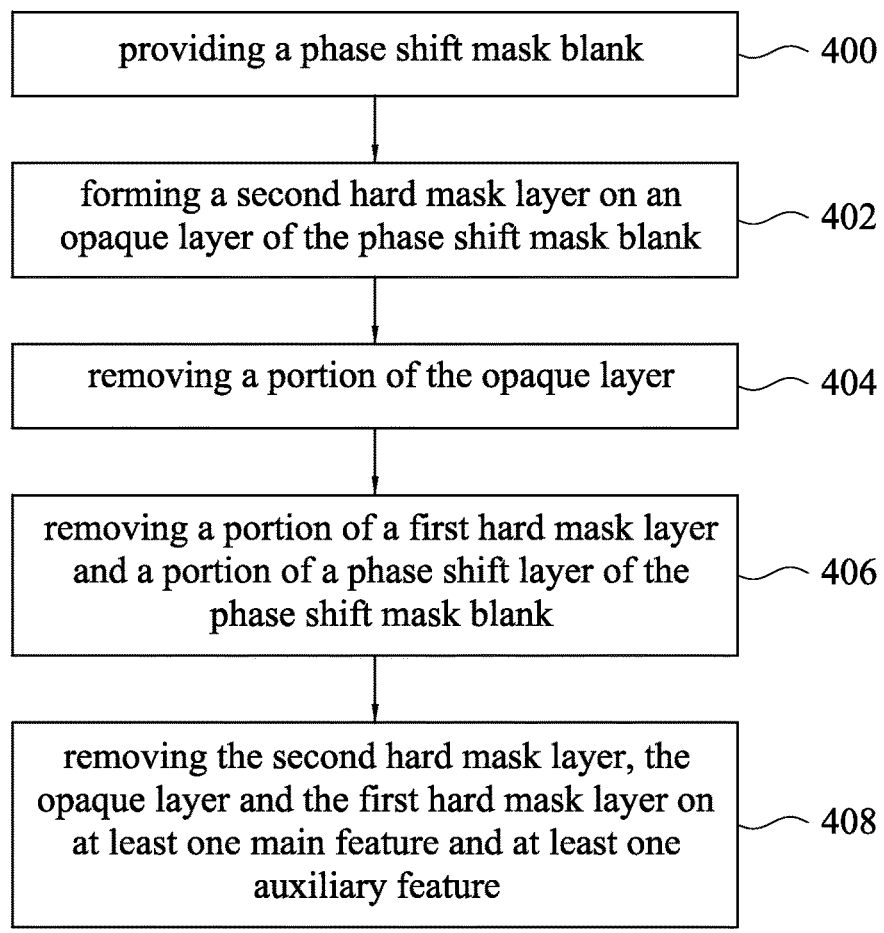
FIG. 4 is a flow chart of a method for manufacturing a phase shift mask in accordance with various embodiments.

Referring to FIG. 4 with FIG. 3A through FIG. 3H, FIG. 4 is a flow chart of a method for manufacturing a phase shift mask in accordance with various embodiments. The method begins at operation 400, where a phase shift mask blank 300 is provided. In some examples, as shown in FIG. 3A, the phase shift mask blank 300 includes a transparent substrate 302, and a phase shift layer 304, a hard mask layer 306 and an opaque layer 308 sequentially disposed on the transparent substrate 302. The transparent substrate 302 may be a quartz flat plate.

The phase shift layer 304 is formed on the transparent substrate 302 using, for example, a chemical vapor deposition technique. In some examples, the operation of forming the phase shift layer 304 includes forming the phase shift layer 304 including a MoSi layer. The hard mask layer 306 is formed on the phase shift layer 304 using, for example, a chemical vapor deposition technique. A thickness 310 of the phase shift layer 304 may be greater than a thickness 312 of the hard mask layer 306. In some examples, the thickness 310 of the phase shift layer 304 may range from about 69 nm to about 76 nm, and the thickness 312 of the hard mask layer 306 may range from about 3 nm to about 10 nm. The phase shift layer 304 has an etching selectivity with respect to the hard mask layer 306. For example, an etching rate of the phase shift layer 304 is greater than an etching rate of the hard mask layer 306.

In some examples, the operation of forming the hard mask layer 306 includes forming the hard mask layer 306 including a MoSi based material, such as MoSi. In some exemplary examples, the MoSi based material of the hard mask layer 306 is formed to contain about 1 weight percent to about 2 weight percent molybdenum, about 50 weight percent to about 55 weight percent silicon and about 40 weight percent to about 50 weight percent nitrogen. In some examples, the operation of forming the hard mask layer 306 includes forming the hard mask layer 306 including $Si_xN_y$, $SiO_2$, $SiO_uN_v$, or any combination thereof, where u, v, x, y are greater than 0. In certain examples, the hard mask layer 306 is formed to include a multilayered structure. For example, the hard mask layer 306 includes a tantalum layer and a tantalum oxide layer under the tantalum layer, or a titanium layer and a titanium oxide layer under the titanium layer.

The opaque layer 308 is formed on the hard mask layer 306 using, for example, a sputtering deposition technique or an evaporation deposition technique. In some examples, the operation of forming the opaque layer 308 includes forming the opaque layer 308 including Cr or $CrO_x$, where x is greater than 0. In some exemplary examples, a thickness 314 of the opaque layer 308 ranges from about 44 nm to about 52 nm.

As shown in FIG. 3A, the phase shift mask blank 300 may optionally include a hard mask material layer 316 and a photosensitive layer 318. The hard mask material layer 316 is formed to blanketly cover the opaque layer 308 using, for example, a chemical vapor deposition technique. In some examples, the operation of forming the hard mask material layer 316 includes forming the hard mask material layer 316 including $SiO_2$ or $SiO_xN_y$, where x, y are greater than 0. In some exemplary examples, a thickness 320 of the hard mask material layer 316 ranges from about 3 nm to about 15 nm. For example, the thickness 320 of the hard mask material layer 316 may range from about 5 nm to about 10 nm. The photosensitive layer 318 is formed to blanketly cover the hard mask material layer 316 using, for example, a spin coating technique. In some examples, the operation of forming the photosensitive layer 318 includes forming the photosensitive layer 318 including a photoresist material.

At operation 402, as shown in FIG. 3B and FIG. 3C, a hard mask layer 322 is formed. In some examples, in the operation of forming the hard mask layer 322, the photosensitive layer 318 is patterned using, for example, a photolithography technique to remove a portion of the photosensitive layer 318 and to expose a portion of the hard mask material layer 316, as shown in FIG. 3B. Then, as shown in FIG. 3C, the portion of the hard mask material layer 316 exposed by the photosensitive layer 318 is removed by an etching technique with the remaining portion of the photosensitive layer 318 as an etching mask, to transfer the pattern of the photosensitive layer 318 into the hard mask material layer 316 and to expose a portion of the opaque layer 308 under the portion of the hard mask material layer 316, so as to complete formation of the hard mask layer 322. Subsequently, as shown in FIG. 3D, the remaining photosensitive layer 318 is removed using, for example, a stripping technique.

At operation 404, as shown in FIG. 3E, the portion of the opaque layer 308 exposed by the hard mask layer 322 is removed by an etching technique with the hard mask layer 322 as an etching mask, to transfer the pattern of the hard mask layer 322 into the opaque layer 308 and to expose a portion of the hard mask layer 306 under the portion of the opaque layer 308. After the operation of removing the portion of the opaque layer 308 is completed, the hard mask layer 322 is removed. In some examples, the hard mask layer 322 is removed after a subsequent removing operation of the hard mask layer 306 and the phase shift layer 304.

At operation 406, as shown in FIG. 3F, the portion of the hard mask layer 306 exposed by the opaque layer 308 and a portion of the phase shift layer 304 underlying the hard mask layer 306 are removed by, for example, a dry etching technique with the opaque layer 308 as an etching mask, to transfer the pattern of the opaque layer 308 into the hard mask layer 306 and the phase shift layer 304. The operation of removing the portion of the hard mask layer 306 and the portion of the phase shift layer 304 includes exposing a portion of the transparent substrate 302 under the portion of the phase shift layer 304.

Referring to FIG. 3F again, the operation of removing the portion of the phase shift layer 304 forms the phase shift layer 304 including at least one main feature 324, at least one auxiliary feature 326, and a border 328. In some exemplary examples, the phase shift layer 304 is formed to include two auxiliary features 326. The auxiliary features 326 are separated from the main feature 324 and are adjacent to the main feature 324, and the border 328 encloses the main feature 324 and the auxiliary features 326. The auxiliary features 326 may be scattering bars.

At operation 408, as shown in FIG. 3G and FIG. 3H, the portions of the opaque layer 308 and the portions of the hard mask layer 306 on the main feature 324 and the auxiliary features 326 are removed. The portions of the opaque layer 308 on the main feature 324 and the auxiliary features 326 are firstly removed to expose the portions of the hard mask layer 306 on the main feature 324 and the auxiliary features 326, as shown in FIG. 3G. Then, as shown in FIG. 3H, the portions of the hard mask layer 306 on the main feature 324 and the auxiliary features 326 are removed to expose the main feature 324 and the auxiliary features 326, so as to complete manufacturing of a phase shift mask 330.

In accordance with an embodiment, the present disclosure discloses a phase shift mask blank. The phase shift mask blank includes a transparent substrate, a phase shift layer, a first hard mask layer and an opaque layer. The phase shift layer is disposed on the transparent substrate. The first hard mask layer is disposed on the phase shift layer. The phase shift layer has an etching selectivity with respect to the first hard mask layer. The opaque layer is disposed on the first hard mask layer.

In accordance with another embodiment, the present disclosure discloses a phase shift mask. The phase shift mask includes a transparent substrate, a phase shift layer, a hard mask layer and an opaque layer. The phase shift layer is disposed on a portion of the transparent substrate and includes at least one main feature, at least one auxiliary feature and a border. The auxiliary feature is separated from the main feature and is adjacent to the main feature. The border encloses the main feature and the auxiliary feature. The hard mask layer is disposed on the border. The phase shift layer has an etching selectivity with respect to the hard mask layer. The opaque layer disposed on the hard mask layer.

In accordance with yet another embodiment, the present disclosure discloses a method for manufacturing a phase shift mask. In this method, a phase shift mask blank is provided. The phase shift mask blank includes a transparent substrate, and a phase shift layer, a first hard mask layer and an opaque layer sequentially disposed on the transparent substrate. A second hard mask layer is formed on the opaque layer. The operation of forming the second hard mask layer includes exposing a portion of the opaque layer. The portion of the opaque layer is removed to expose a portion of the first hard mask layer. The portion of the first hard mask layer and a portion of the phase shift layer underlying the first hard mask layer are removed to expose a portion of the transparent substrate. The operation of removing the portion of the phase shift layer forms the phase shift layer including at least one main feature, at least one auxiliary feature, and a border enclosing the at least one main feature and the at least one auxiliary feature. The second hard mask layer, the opaque layer and the first hard mask layer on the at least one main feature and the at least one auxiliary feature are removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A phase shift mask blank, comprising:
   a transparent substrate;
   a phase shift layer disposed on the transparent substrate;
   a first hard mask layer disposed on the phase shift layer, wherein the phase shift layer has an etching selectivity with respect to the first hard mask layer, and the first hard mask layer comprises a tantalum layer and a tantalum oxide layer under the tantalum layer, or a titanium layer and a titanium oxide layer under the titanium layer; and
   an opaque layer disposed on the first hard mask layer.

2. The phase shift mask blank of claim 1, wherein the phase shift layer comprises a MoSi layer.

3. The phase shift mask blank of claim 1, wherein the first hard mask layer has a thickness ranging from 3 nm to 10 nm.

4. The phase shift mask blank of claim 1, wherein the opaque layer comprises $CrO_x$ or Cr, where x is greater than 0.

5. The phase shift mask blank of claim 1, further comprising a second hard mask layer disposed on the opaque layer, wherein the second hard mask layer comprises $SiO_2$ or $SiO_xN_y$, where x, y are greater than 0.

6. The phase shift mask blank of claim 5, wherein the second hard mask layer has a thickness ranging from 3 nm to 15 nm.

7. The phase shift mask blank of claim 5, further comprising a photosensitive layer disposed on the second hard mask layer.

8. A phase shift mask, comprising:
a transparent substrate;
a phase shift layer disposed on a portion of the transparent substrate, wherein the phase shift layer comprises:
   at least one main feature;
   at least one auxiliary feature separated from the at least one main feature and adjacent to the at least one main feature; and
   a border enclosing the at least one main feature and the at least one auxiliary feature;
a hard mask layer disposed on the border, wherein the phase shift layer has an etching selectivity with respect to the hard mask layer, and the hard mask layer comprises a tantalum layer and a tantalum oxide layer under the tantalum layer, or a titanium layer and a titanium oxide layer under the titanium layer; and
an opaque layer disposed on the hard mask layer.

9. The phase shift mask of claim 8, wherein the phase shift layer comprises a MoSi layer.

10. The phase shift mask of claim 8, wherein the hard mask layer has a thickness ranging from 3 nm to 10 nm.

11. A method for manufacturing a phase shift mask, comprising:
providing a phase shift mask blank, wherein the phase shift mask blank comprises a transparent substrate, and a phase shift layer, a first hard mask layer and an opaque layer sequentially disposed on the transparent substrate, wherein the first hard mask layer comprises a tantalum layer and a tantalum oxide layer under the tantalum layer, or a titanium layer and a titanium oxide layer under the titanium layer;
forming a second hard mask layer on the opaque layer, wherein forming the second hard mask layer comprises exposing a portion of the opaque layer;
removing the portion of the opaque layer to expose a portion of the first hard mask layer;
removing the portion of the first hard mask layer and a portion of the phase shift layer underlying the first hard mask layer to expose a portion of the transparent substrate, wherein removing the portion of the phase shift layer forms the phase shift layer comprising at least one main feature, at least one auxiliary feature, and a border enclosing the at least one main feature and the at least one auxiliary feature; and
removing the second hard mask layer, the opaque layer and the first hard mask layer on the at least one main feature and the at least one auxiliary feature.

12. The method of claim 11, wherein the phase shift layer comprises a MoSi layer, and the first hard mask layer has a thickness ranging from 3 nm to 10 nm.

13. The method of claim 11, wherein forming the second hard mask layer comprises:
forming a hard mask material layer to blanketly cover the opaque layer;
forming a photosensitive layer to blanketly cover the hard mask material layer;
patterning the photosensitive layer to expose a portion of the hard mask material layer; and
removing the portion of the hard mask material layer to form the second hard mask layer exposing the portion of the opaque layer.

* * * * *